(12) United States Patent
Xu et al.

(10) Patent No.: US 10,000,384 B2
(45) Date of Patent: Jun. 19, 2018

(54) METHOD OF LASER DIRECT SYNTHESIS OF GRAPHENE

(71) Applicant: Purdue Research Foundation, West Lafayette, IN (US)

(72) Inventors: Xianfan Xu, West Lafayette, IN (US); Dapeng Wei, Chongqing (CN); Peide Ye, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 783 days.

(21) Appl. No.: 13/906,057

(22) Filed: May 30, 2013

(65) Prior Publication Data
US 2013/0323158 A1 Dec. 5, 2013

Related U.S. Application Data

(60) Provisional application No. 61/655,540, filed on Jun. 5, 2012.

(51) Int. Cl.
| | | |
|---|---|---|
| *C01B 31/04* | (2006.01) | |
| *C01B 32/184* | (2017.01) | |
| *B82Y 30/00* | (2011.01) | |
| *B82Y 40/00* | (2011.01) | |
| *C30B 29/18* | (2006.01) | |

(52) U.S. Cl.
CPC ............ *C01B 32/184* (2017.08); *B82Y 30/00* (2013.01); *B82Y 40/00* (2013.01); *C30B 29/18* (2013.01)

(58) Field of Classification Search
CPC ..... B82Y 30/00; B82Y 40/00; C01B 31/0446; C03C 17/22
See application file for complete search history.

(56) References Cited

PUBLICATIONS

Laser direct growth of graphene on silicon substrate, Wei et al., Applied Physics Letters 100, 023110 (2012).*
Direct Formation of Wafer Scale Graphene Thin Layers on Insulating Substrates by Chemical Vapor Deposition, Su et al., Nano Lett. 2011, 11, 3612-3616.*
Wei et al., Laser direct growth of graphene on silicon substrate, Applied Physics Letters 100, 023110, 2012.*
Su et al., Direct Formation of Wafer Scale Graphene Thin Layers on Insulating Substrates by Chemical Vapor Deposition, Nano Lett. 2011, 11, 3612-3616.*
De Heer, W. A. MRS Bull. 2011, 36, 632-639.
Hwang, D. J.; Ryu, S. G.; Grigoropoulos. C. P. Nanotechnol. 2011, 22, 385303.
Malard, L. M.; Pimenta, M. A.; Dresselhaus, G.; Dresselhaus, M. S. Phys. Rep. 2009, 473, 51-87.
Tang, B.; Guoxin, H.; Gao, H. Y. Appl. Spectrosc. Rev. 2010, 45, 367-407.
Scheibe, H. J.; Drescher, D.; Alers, P. Fresenius J. Anal. Chem. 1995, 353, 695-697.

(Continued)

*Primary Examiner* — Hua Qi
(74) *Attorney, Agent, or Firm* — Maginot, Moore & Beck LLP

(57) ABSTRACT

A method of forming single and few layer graphene on a quartz substrate in one embodiment includes providing a quartz substrate, melting a portion of the quartz substrate, diffusing a form of carbon into the melted portion to form a carbon and quartz mixture, and precipitating at least one graphene layer out of the carbon and quartz mixture.

12 Claims, 9 Drawing Sheets

(56) References Cited

PUBLICATIONS

Reznik, A; Richter, V.; Kalish, R. Phys. Rev. B. 1997, 56, 7930-7934.

Kahng, Y. H.; Chio, J.; Park, B. C.; Kim, D. H.; Choi, J. H.; Lyou, J.; Ahn, S. J. Nanotechnol. 2008, 19, 195705.

Bae, S.; Kim, H; Lee, Y.; Xu, X.; Park, J. S.; Zheng, Y.; Balakrishnan, J.; Lei, T.; Ri Kim, H.; Song, Y. I.; Kim, Y. J.; Kim, K. S.; Ozyilmaz, B.; Ahn, J. H.; Hong B. H.; Iijima, S. Nat. Nanotechnol. 2010, 5, 574-578.

Wei, Dapeng and Xu, Xianfan, "Laser Direct Growth of Graphene on Silicon Substrate," Applied Physics Letters 100, 023110 (2012)d (3 pages).

Allen, M. J.; Tung, V. C.; Kaner, R. B. Chem. Rev. 2010, 110, 132-145.

Novoselov, K. S.; Geim, A. K.; Morozov, S. V.; Jiang, D.; Katsnelson, M. I.; Dubonos, S. V.; Firsov. A. A. Nature. 2005, 438, 197-200.

Morozov, S. V.; Novoselov, K. S.; Katsnelson, M. I.; Schedin, F.; Elias, D. C.; Jaszczak, J. A.; Geim, A. K. Phys. Rev. Lett. 2008, 100, 016602.

Berger, C.; Song, Z. M.; Li, X. B.; Wu, X. S.; Brown, N.; Naud, C.; Mayou, D.; Li, T. B.; Hass, J.; Marchenkov, A. N.; Conard, E. H.; First, P. N.; De Heer, W. A. Science. 2006, 312, 1191-1196.

Schwierz, F. Nature Nanotech. 2010, 5, 487-496.

Liu, C. G.; Yu, Z. N.; Neff, D.; Zhamu, A.; Jang, B. Z. Nano Lett. 2010, 10, 4863-4868.

Liu, Y. X.; Dong, X. C.; Chen, P. Chem. Soc. Rev. 2012, 41, 2283-2307.

Novoselov, K. S.; Geim, A. K.; Morozov, S. V.; Jiang, D.; Zhang, Y.; Dubonos, S. V.; Grigorieva, I. V.; Firsov, A. A. Science.2004, 306, 666-669.

Li, X. S.; Cai, W. W; An, J. H.; Kim, S.; Nah, J.; Yang, D. X.; Piner, R.; Velamakanni, A.; Jung, I.; Tutuc, E.; Banerjee, S. K.; Colombo, L; Ruoff, R. S. Science. 2009, 324,1312-1314.

Kim, K. S.; Zhao, Y.; Jang, H.; Lee, S. Y.; Kim, J. M.; Kim, K S.; Ahn, J. H.; Kim, P.; Choi, J. Y.; Hong, B. H. Nature. 2009, 457, 706-710.

Park, J. B.; Jeong, S. H.; Jeong, M. S.; Lim, S. C.; Lee, I. H.; Lee, Y. H. Nanotechnol. 2009, 20, 185604.

Lee, S.; Toney, M. F.; Ko, W.; Randel, J. C.; Jung, H. J.; Munskata, K.; Lu, J.; Geballe, T. H.; Beasley, M. R.; Sinclair, R.; Manoharan, H. C.; Salleo, A. ACS Nano. 2010, 4, 7524-7530.

Park, J. B.; Xiong, W.; Gao, Y.; Qian, M.; Xie, Z. Q.; Mitchell, M.; Zhou, Y. S.; Han, G. H.; Jiang, L; Lu, Y. F. Appl. Phys. Lett. 2011, 98, 123109.

Cancado, L. G.; Jorio, A.; Ferreira, E. H. M.; Stavale, F.; Achete, C. A.; Capaz, R. B.; Moutinho, M. V. O.; Lombardo, A.; Kulmala, T. S.; Ferrari, A. C. Nano Lett. 2011, 11, 3190-3196.

Pimenta, M. A.; Dresselhaus, G.; Dresselhaus, M. S.; Cancado, L G.; Jorio, A.; Saito, R. Phys. Chem. Chem. Phys. 2007, 9, 1276-1291.

Reina, A.; Jia, X. T.; Ho, J.; Nezich, D.; Son, H. B.; Bulovic, V.; Dresselhaus, M. S.; Kong, J. Nano Lett. 2009, 9, 30-35.

Ferrari, A. C.; Meyer, J. C.; Scardaci, V.; Casiraghi, C.; Lazzeri, M.; Mauri, F.; Piscanec, S.; Jiang, D.; Novoselov, K. S.; Roth, S.; Geim, A. K. Phys. Rev. Lett. 2006, 97, 187401.

Zheng M.; Takei, K.; Hsia, B.; Fang, H.; Zhang, X. B.; Ferralis, N.; Ko, H.; Chueh, Y. L.; Zhang, Y. G.; Mabodian, R.; Javey, A. Appl. Phys. Lett. 2010, 96, 063110.

Cao, H. L.; Yu, Q. K.; Colby, R.; Pandey, D.; Park, C. S.; Lian, J.; Zemlyanov, D.; Childres, I.; Drachev, V.; Stach, E. A.; Hussain, M.; Li, H.; Pei, S. S.; Chen, Y. P. J. Appl. Phys. 2010, 107, 044310.

Cancado, L. G.; Takai, K; Enoki, T.; Endo, M.; Kim, Y. A.; Mizusaki, H.; Jorio, A.; Coelho, L. N.; Magalhaes-Paniago, R.; Pimenta, M. A. Appl. Phys. Lett. 2006, 88, 163106.

Rümmeli, M. H.; Bachmatiuk, A.; Scott, A.; Borrnert, F.; Warner, J. H.; Hoffman, V.; Lin, J. H.; Cuniberti, G.; Buchner, B. ACS Nano. 2010, 4, 4206-4210.

Li, X. S.; Magnuson, C. W.; Venugopal, A.; An, J. H.; Suk, J. W.; Han, B. Y.; Borysiak, M.; Cai, W. W.; Velamakanni, A.; Zhu, Y. W.; Fu, L. F.; Vogel, E. M.; Voelkl, E.; Colombo, L.; Ruoff, R. S. Nano Lett. 2010, 10, 4328-4334.

Bhaviripudi, S.; Jia, X. T.; Dresselhaus, M. S.; Kong, J. Nano Lett. 2010, 10, 4128-4133.

Yu, Q. K.; Jauregui, L. A.; Wu. W. W.; Colby, R.; Tian, J. F.; Su, Z. H.; Cao, H. L.; Liu, Z. H.; Pandey. D.; Wei, D. G.; Chung, T. F.; Peng, P.; Guisinger, N. P.; Stach, E. A.; Bao, J. M.; Pei, S. S.; Chen, Y. P. Nature Mater. 2011, 10, 443-449.

Yu, Q. K.; Lian, J.; Siriponglert, S.; Li, H.; Chen, Y. P.; Pei, S. S. Appl. Phys. Lett. 2008, 93, 113103.

Li, X.; Zhu, Y.; Cai, W.; Borysiak, M.; Han, B.; Chen, D.; Piner, R. D.; Colombo, L.; Ruoff, R. S. Nano Lett. 2009, 9, 4359-4363.

Zhao, J.; Pei, S.; Ren, W.; Gao, L; Cheng, H. M. ACS Nano 2010, 4, 5245-5252.

Park, H. J.; Meyer, J.; Roth, S.; Skákalová, V. Cabon. 2010, 48, 1088-1094.

Zhang, L; Shi, Z.; Wang, Y.; Yang, R; Shi, D.; Zhang, G. Nano Res. 2011, 4, 315.

\* cited by examiner

US 10,000,384 B2

METHOD OF LASER DIRECT SYNTHESIS OF GRAPHENE

This application claims the benefit of U.S. Provisional Application No. 61/655,540 filed Jun. 5, 2012, the entire contents of which are each herein incorporated by reference.

This invention was made with government support under CMMI 1120577 awarded by the National Science Foundation and under N66001-08-1-2037 awarded by the Defense Advanced Research Projects Agency (DARPA). The government has certain rights in the invention.

TECHNICAL FIELD

This invention relates generally to elemental carbon compositions and, more particularly, to products having graphene and methods of producing graphene.

BACKGROUND

Graphene is a crystal of carbon atoms arranged in a honeycomb lattice. Single and few-layer graphene has emerged as a promising material for novel applications in electronics because the high carrier mobility and perfect charge carrier confinement of graphene result in outstanding electronic transport properties. Graphene thus holds promises for widespread applications including field-effect transistors, super-capacitors, and sensors. The semi-metallic nature of graphene when coupled with high carrier mobility and low opacity also makes graphene a good candidate for use as a transparent conductor for photovoltaic devices, touch panels, and displays. Graphene structures also have high chemical resistance and are relatively flexible when compared to some other transparent conductor materials such as indium tin oxide (ITO). Bilayer graphene (BLG) in particular holds further promise for use in post-silicon electronics applications because a bandgap up to 250 meV can be induced in the material using an electric field, which is not possible with single or monolayer graphene (SLG), and because exciton binding energies in BLG are tunable by electric field-induced bandgap.

A monolayer or single layer graphene is a plane of carbon atoms bonded in a hexagonal array. Multiple layers of graphene are typically formed by first forming a single layer of graphene and them transporting the single layer onto another layer of graphene. The main approach in fabricating graphene has been mechanical exfoliation and chemical vapor deposition (CVD). Growth of large-scale single or few-layers graphene has been shown on Cu or Ni surfaces. For device fabrication, the graphene grown on Cu or Ni is subsequently transferred onto another insulating substrate. In addition to adding complexity, the transportation step increases the risk of contaminating the graphene sheet.

Recently, it has been reported that a laser technique can be used for growing graphene on a nickel foil and also for epitaxially growing graphene on SiC. A method wherein few-layer graphene was grown on a silicon substrate using a laser-based technique without any metal catalysts has also been demonstrated. These methods produce graphene on a conductive substrate, however, and a transfer process is therefore needed for fabricating a graphene device on an insulating substrate.

What is needed therefore is a method of producing single or few layer graphene on a non-conductive surface. A method of producing few-layer graphene without the need to transport a single layer graphene is also needed.

SUMMARY

A method of forming single and few layer graphene on a quartz substrate in one embodiment includes providing a quartz substrate, melting a portion of the quartz substrate, diffusing a form of carbon into the melted portion to form a carbon and quartz mixture, and precipitating graphene layer out of the carbon and quartz mixture.

In another embodiment, a method of forming at least one graphene layer includes providing a quartz substrate, forming a photoresist layer portion on an upper surface of the quartz substrate, the photoresist layer portion including the form of carbon, decomposing the photoresist layer portion to release the form of carbon, and coalescing the form of carbon into at least one graphene layer on the quartz substrate.

DETAILED DESCRIPTION

Figure 1:
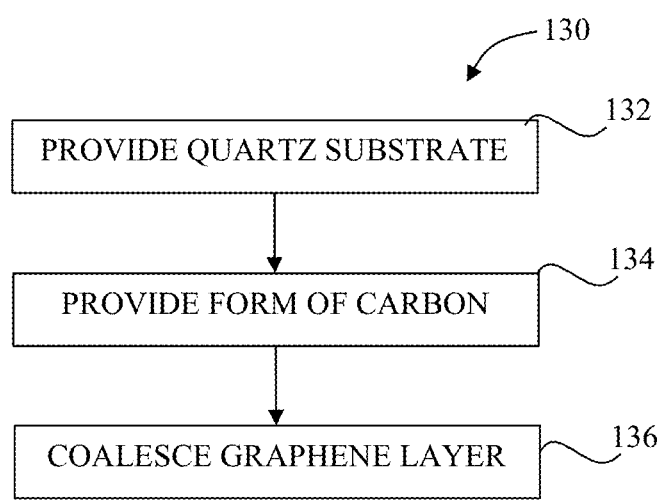
FIG. 1 depicts a basic process which can be followed to form a graphene film.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to one skilled in the art to which this disclosure pertains.

A graphene dot is formed generally in accordance with a process 130 shown in FIG. 1. At block 132, a quartz substrate is provided. A form of carbon is then provided above an upper surface of the quartz substrate at block 134. The form of carbon is heated and coalesced into a graphene spot of one or more layers at block 136.

Figure 2:
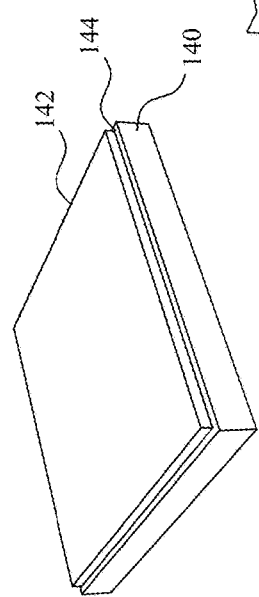
FIG. 2 depicts a quartz substrate with a form of carbon provided by a photoresist layer formed on the upper surface of the quartz substrate in accordance with the process of FIG. 1.

Additional detail for one example of the process 130 is described with initial reference to FIG. 2. Initially, a quartz substrate 140 was provided. The quartz substrate in this example was a 1×2 cm quartz wafer which was cleaned by ultra-sonication in methanol, acetone, and DI water for 3 minutes. The quartz substrate 140 was then dried by high purity $N_2$ gas.

A photoresist layer 142 in the form of a photoresist film was spin-coated on an upper surface 144 of the quartz substrate 140. The photoresists layer 142 was a 1:6 diluted S-1805 photoresist solution spun at 10,000 rpm. The resulting thickness of the photoresists layer 142 was less than 100 nm. While the photoresist layer 142 is shown in FIG. 2 as covering only a portion of the upper surface 144, in some embodiments, the photoresist layer 142 covers the entire upper surface 144. Once the desired photoresist layer 142 is formed, the quartz substrate 140 was baked for 5 minutes at 120° C.

Figure 3:
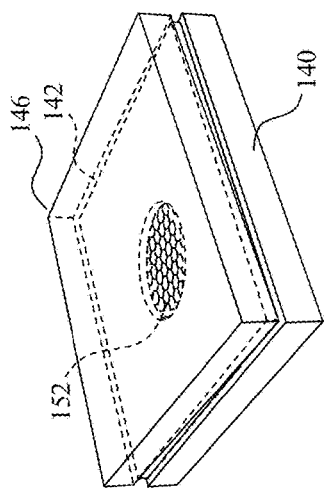
FIG. 3 depicts a quartz wafer positioned on the upper layer of the photoresist layer of FIG. 2 above the portion of the quartz substrate which is to be melted so as to trap the form of carbon above the upper surface of the quartz substrate when the form of carbon is released from the photoresist.

Next, a quartz wafer 146 was positioned over the photoresist layer 142 (see FIG. 3). The quartz wafer 146 was previously cleaned and dried in the same manner as the quartz substrate 140. The quartz substrate 140 and quartz wafer 146 were then fixed on a high precision piezoelectric stage and a DC motorized stage by two clamps in a growth chamber (not shown).

Figure 4:
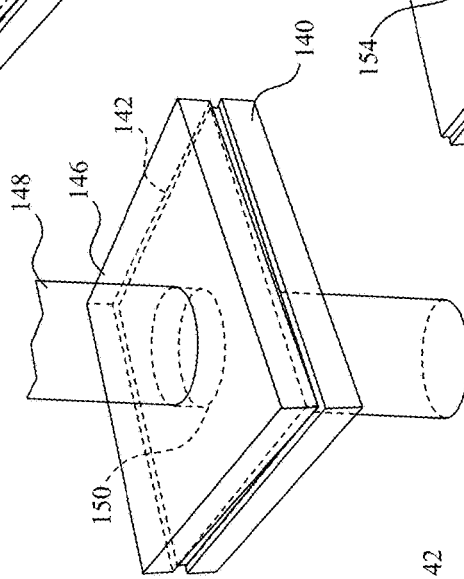
FIG. 4 depicts a continuous wave laser heating the photoresist layer portion within a nitrogen gas atmosphere.

The growth chamber was pumped and purged with a high-purity $N_2$ gas, and maintained at a pressure below 0.1 Torr. A beam 148 from a continuous wave (CW) Nd:YAG laser (Coherent Verdi) with a wavelength of 532 nm and a beam width of about 45 microns was focused on the S-1805 photoresist layer 142 through the transparent quartz wafer 146 using a lens of 150 mm focal length as depicted in FIG. 4. In this embodiment, the photoresist layer 142 was exposed to the beam 148 at 2.8 Watt for five minutes.

Figure 5:
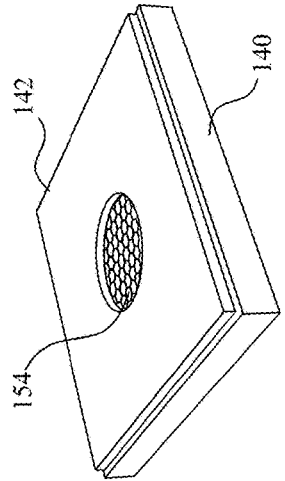
FIG. 5 depicts the configuration of FIG. 4 with the laser de-energized after the photoresist layer has been decomposed to release the form of carbon and the upper surface of the quartz substrate has been melted by heat transferred from the released form of carbon, some of which diffuses into the melted quartz to form a quartz/carbon mixture.
Figure 6:
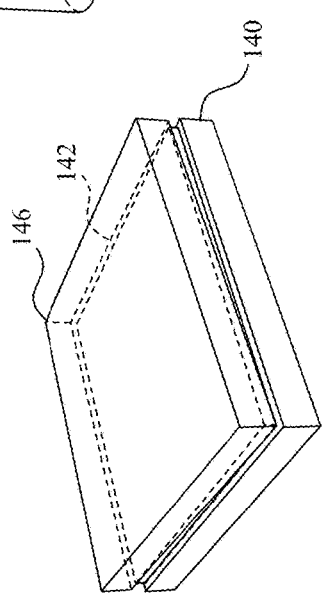
FIG. 6 depicts the configuration of FIG. 5 after the quartz wafer has been removed and the melted quartz has cooled resulting in precipitation and/or coalescence of one or more graphene layers on the formerly melted portion of the quartz substrate.

The focused beam 148 resulted in a high temperature of the portion 150 of the photoresist layer 142 that was in the beam 148, with the remainder of the photoresist layer 142 remaining at or about room temperature. The beam 148 thus heated the photoresist layer 142 causing the portion 150 of the photoresist layer 142 within the footprint of the beam 148 to decompose resulting in a form of carbon 152 provided in the photoresist layer 142 to be disassociated with the photoresist layer 142 as depicted in FIG. 5. The quartz wafer 146 inhibited movement of the form of carbon 152 while allowing some gasses formed by the decomposition of the photoresist layer 142 to escape. The beam 148 was de-energized at the end of the five minutes and the form of carbon 152 was allowed to cool. As the form of carbon 152 cooled, it precipitated and/or coalesced into one or more graphene layers 154 (see FIG. 6).

For purpose of this example, the quartz substrate 140 and quartz wafer 146 were then moved by the high precision piezoelectric stage and a DC motorized stage to expose a different portion of the photoresist layer 142 to the beam 148. The high precision piezoelectric stage and DC motorized stage allow for precise positioning of the quartz substrate 140 and quartz wafer 146 with respect to the beam 148. Accordingly, a pattern (discussed below) of one or more graphene layers 154 was formed.

To better understand the formation process of the one or more graphene layers 154 optical images were taken with an optical microscope (Olympus BX40) with reflected light illumination, and atomic force microscopy (AFM) images were taken using an AFM (Veeco Dimension 3100) with the tapping mode under ambient conditions. Raman spectroscopy and mapping was performed using a laser micro-Raman systems (XploRA, with laser excitation at 532 nm) equipped with a motorized sample stage. A 100× objective lens was used, and laser spot size was ~0.6 μm. For Raman spectroscopy, the accumulation time was 20 seconds, and for Raman mapping, each spectrum was an average of 3 acquisitions (3s of accumulation time per acquisition).

Figure 7:
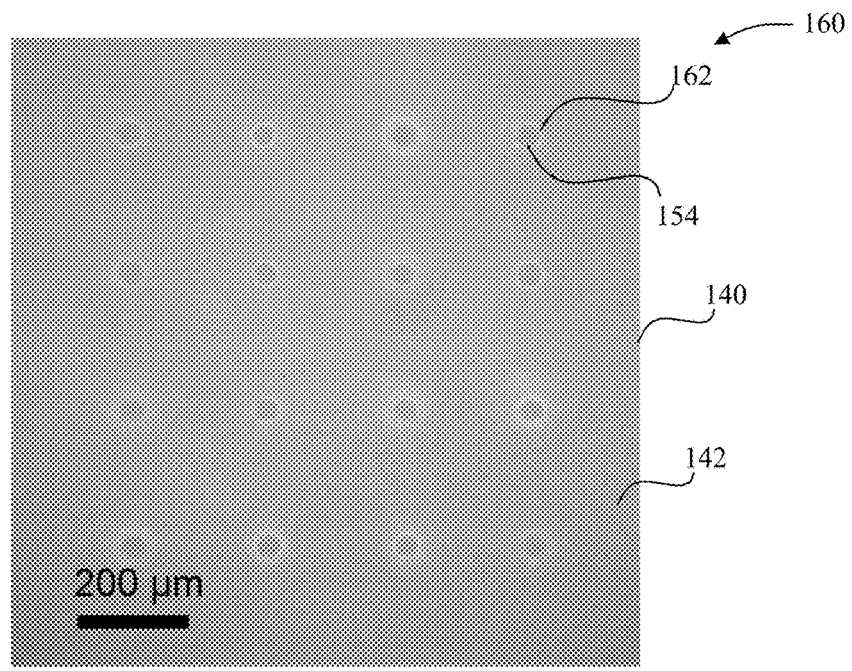
FIG. 7 depicts an optical micrograph of a 4×4 graphene dot array with a spacing of 250 μm formed in accordance with the process of FIG. 1.

FIG. 7 shows an optical micrograph of a 4×4 laser processed area of the quartz substrate 140 with a pattern 160 of one or more graphene layers 154, with a spacing of 250 μm (horizontally and vertically as depicted) between adjacent ones of the one or more graphene layers 154. The one or more graphene layers 154 are shown as visible, round dots with bright rings 162 surrounding the one or more graphene layers 154 as shown more clearly in FIG. 8.

Figure 8:
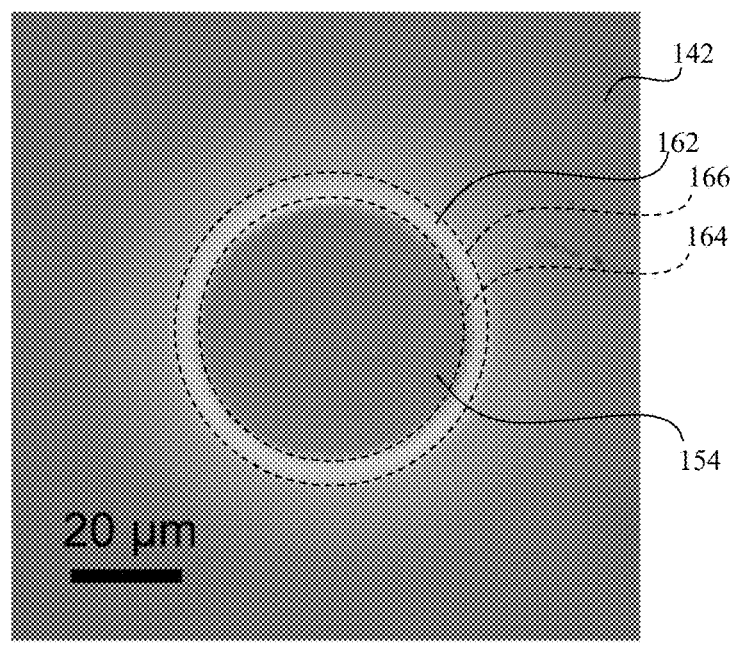
FIG. 8 depicts a magnified optical micrograph of a graphene dot of FIG. 7.

The diameter of the graphene layers or dots 154 is about 50 μm. The higher magnification optical micrograph in FIG. 8 shows that the one or more graphene layers 154 exhibit a uniform and smooth boundary which is clearly defined by the bright rings 162. The rings 162 exhibit a uniform brightness immediately adjacent to the one or more graphene layers 154, with the brightness of the photoresist layer 142 gradually decreasing radially away from the rings 162 and the one or more graphene layers 154. A circle 164 having a diameter of about 43 μm is shown in FIG. 8. The circle 164 corresponds to the outer boundary of the one or more graphene layers 154, and roughly correlates with the beam width of the laser beam 148. A circle 166 having a diameter of about 53 μm is also shown in FIG. 8. The circle 166 corresponds to the outer boundary of the rings 162.

Figure 9:
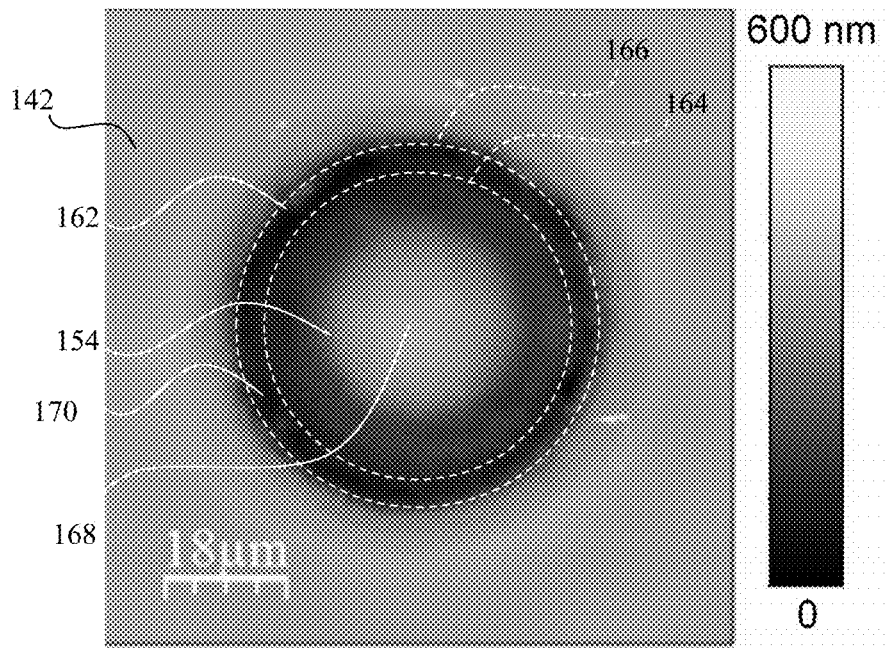
FIG. 9 depicts an AFM image of the graphene dot of FIG. 8.
Figure 10:
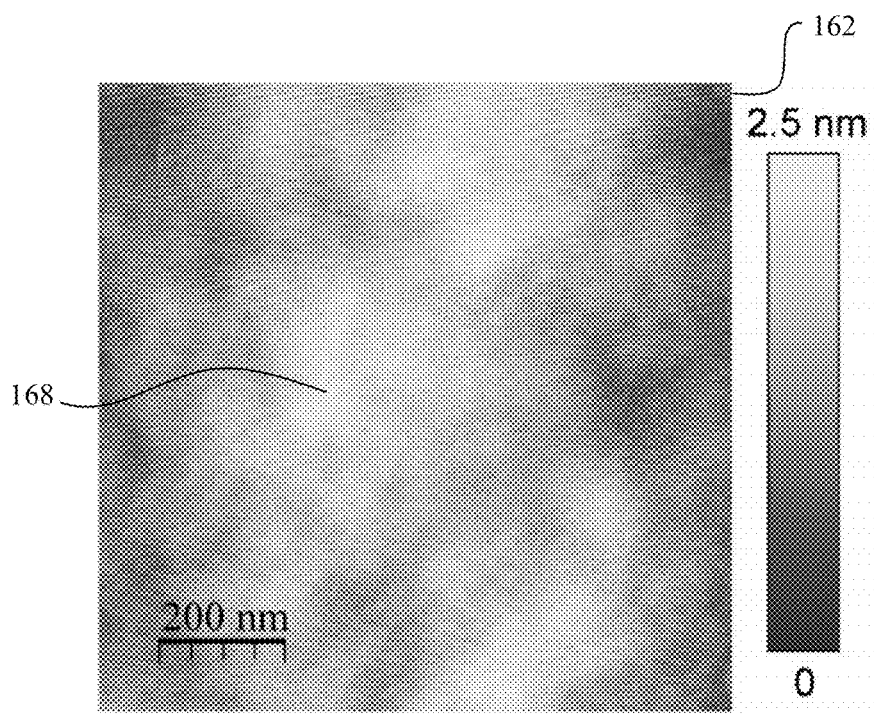
FIG. 10 depicts a magnified AFM image of a central area of the graphene dot of FIG. 9.

FIGS. 9 and 10 are atomic force microscopy (AFM) images of the one or more graphene layers 154. For ease of comparison, the circle 164 of FIG. 8 is replicated in FIG. 9. The circle 166 of FIG. 8 is also replicated in FIG. 9. FIG. 9 shows that the height of the at least one graphene layer drops continuously from an apex 168 at the center of the at least one graphene layer 154 to a nadir 170 in the ring 162. The apex 168 is at about the same height as the remainder of the photoresist layer 142, while the nadir 170 is up to 300 nm lower than the center of the one or more graphene layers 154.

FIG. 10 shows the apex area 168 of the one or more graphene layer 154. FIG. 10 shows that the apex area 168 is relatively flat.

The nature and quality of graphene dots 154 formed by laser irradiation were evaluated using Raman spectroscopy.

The main hallmarks of graphene are three Raman peaks, including D (~1350 cm$^{-1}$), G (~1580 cm$^{-1}$), and 2D (~2700 cm$^{-1}$) bands. The D band is the so-called "defect peak" of graphene, and the intensity ratio of D to G bands ($I_D/I_G$) is a significant parameter to identify disorder of graphene. The 2D band is the most prominent feature in the Raman spectra of graphene, and its position, shape, $I_{2D}/I_G$ intensity ratio, and full width at half-maximum (FWHM) are well-established characteristics of graphene layers.

Figure 11:
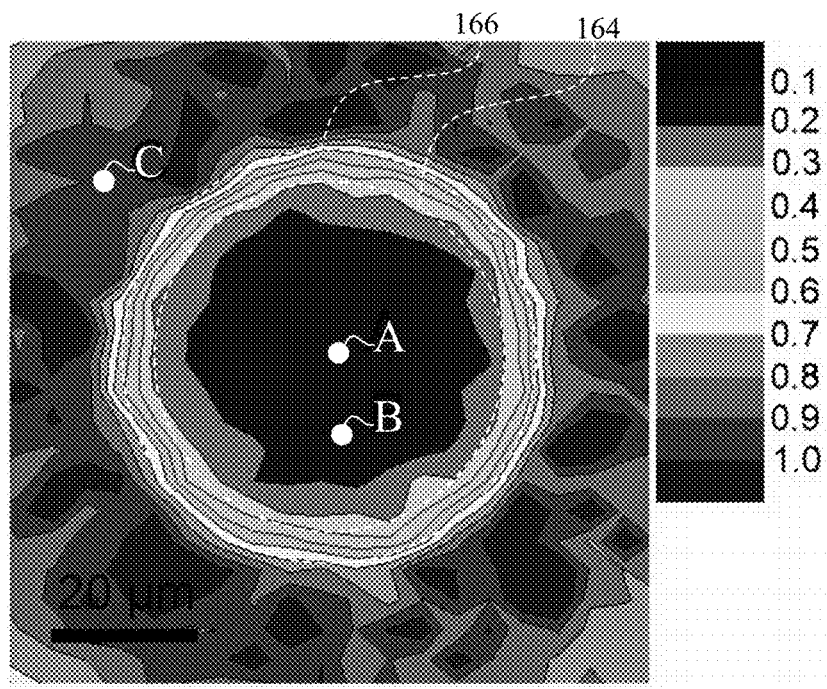
FIG. 11 depicts Raman mapping of the ID/IG ratio of the graphene dot of FIG. 8.
Figure 12:
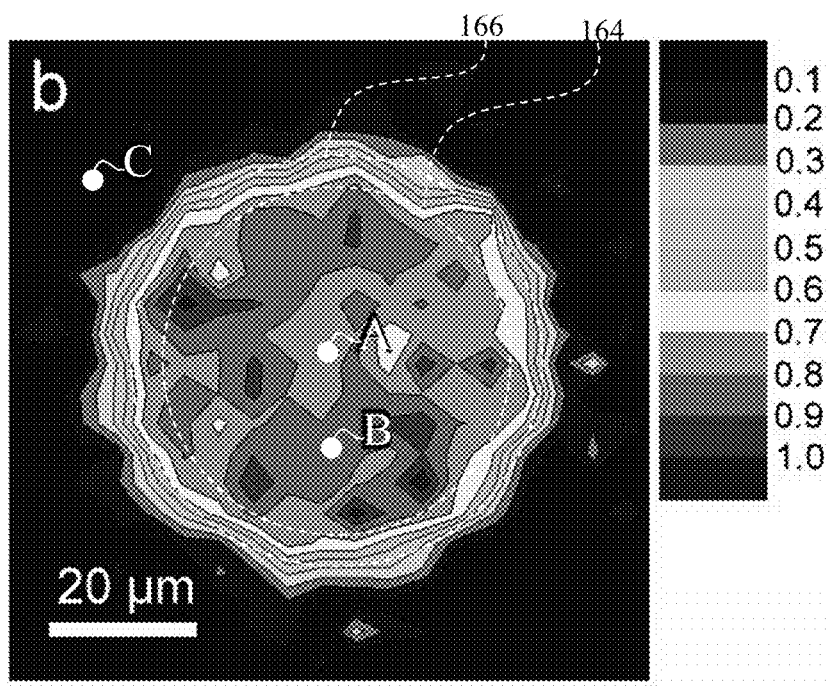
FIG. 12 depicts Raman mapping of the I2D/IG ratio of the graphene dot of FIG. 8.

The scan Raman mapping with the ratio $I_D/I_G$ and $I_{2D}/I_G$ of the graphene layer 154 is shown in FIGS. 11 and 12, respectively. A central circular area within the circle 164 shows low $I_D/I_G$ (0.1-0.2) and high $I_{2D}/I_G$ (0.7-1.0), and its size is similar to the size of laser-processed area.

Between the circle 164 and 166, $I_D/I_G$ increases from 0.3 to 0.6 while the $I_{2D}/I_G$ drops from 0.7 to 0.5. Outside of the circle 166, the $I_D/I_G$ increases abruptly to 0.8-1.0 while the $I_{2D}/I_G$ drops precipitously from 0.4 near the circle 166 to about 0.1 at point "C". Hence, the growth of graphene occurs predominantly within the circle 164 with a transition to carbon between the circle 166 and the circle 164 and then to the photoresist layer 142 (no graphene) outside of the circle 166.

Figure 13:
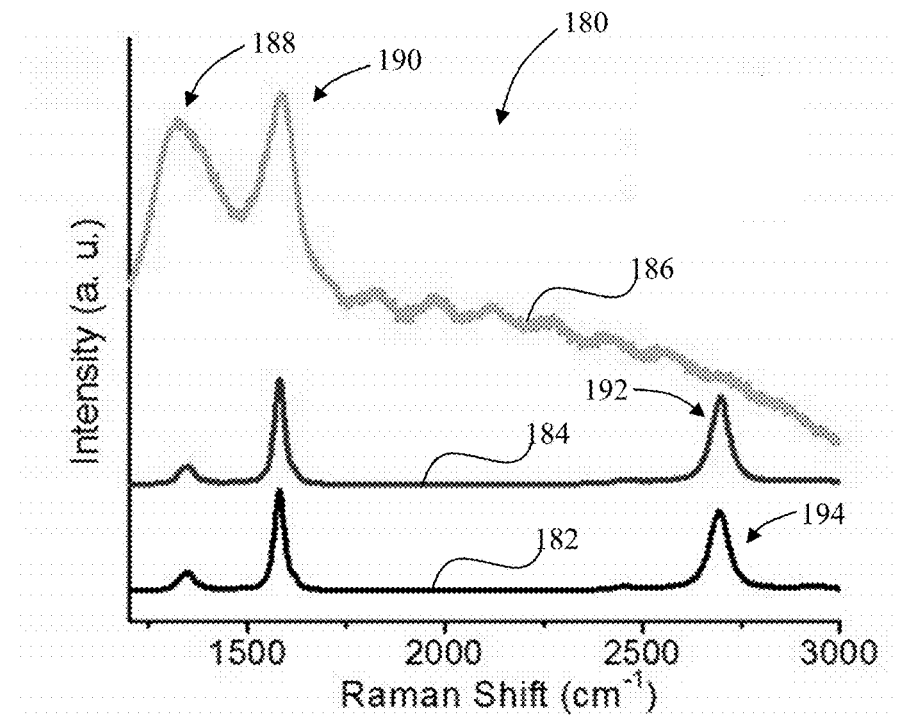
FIG. 13 depicts the Raman spectra from the marked points in FIGS. 11 and 12.

The Raman spectra chart 180 shown in FIG. 13 includes lines 182, 184, and 186 which correspond to the points marked by "A", "B" and "C" in FIGS. 11 and 12. There is no signal of the 2D band outside the laser processed area (circle 166). Rather, the wide and strong D band 188 and G band 190 reveal sp$^2$-rich amorphous carbon on the surface.

Within the circle 164, strong 2D bands 192/194 are evidenced at 2696 cm$^{-1}$ with a FWHM (2D) of 58 cm$^{-1}$ at the points A and B. Monolayer graphene results in a 2D band position at 2680 cm$^{-1}$ with a FWHM (2D) of 30 cm$^{-1}$. The up-shifted and wider 2D bands 192/194 indicate that bi- or tri-layer graphene structures were produced.

The $I_{2D}/I_G$ ratio from 0.7 to 1.0 within the circle 164 also indicates that the graphene layer 154 has bi- or tri-layer structure. On the other hand, the $I_D/I_G$ ratio is an indication of the graphene crystallite sizes, $L_a$(nm), which can be estimated as $L_a=(2.4\times10^{-10})\lambda_1^4(I_D/I_G)^{-1}$, where X is the Raman laser line wavelength in nanometers. From the experimental data, the $I_D/I_G$ ratio from 0.1 to 0.2 corresponds to the graphene domain size between 96 and 192 nm. Moreover, the correlation of the size of the area of graphene formation with the size of the beam width of the laser 148 indicates that the size, shape, and location of the formed graphene can be precisely controlled by controlling the area irradiated with the laser beam 148.

From the topographical data of FIG. 9, it is evident that topographical remodeling occurred in the quartz substrate 140 itself. For example, the photoresist layer 142 has a thickness of less than 100 nm, yet the height excursion across the at least one graphene layer 154 approaches 300 nm. Consequently, in addition to decomposing the photoresist layer 142, the laser beam 148 caused the quartz substrate 140 immediately below the portion 150 (see FIG. 4) to melt. Since the quartz substrate 140 does not exhibit increased temperatures when directly exposed to the laser beam 148, the heat necessary for melting the quartz substrate 140 is necessarily transmitted to the quartz substrate 140 by another mechanism.

In order to investigate further the remodeling of the quartz substrate 140, a series of microscope images and Raman spectra were obtained after varying exposure times of the quartz substrate 140, photoresist layer 142, and quartz wafer 146 to the laser beam 148. The images are depicted in FIG. 14 wherein the scale bars are each 20 µm, and the Raman spectra are depicted in FIG. 15.

Figure 14:
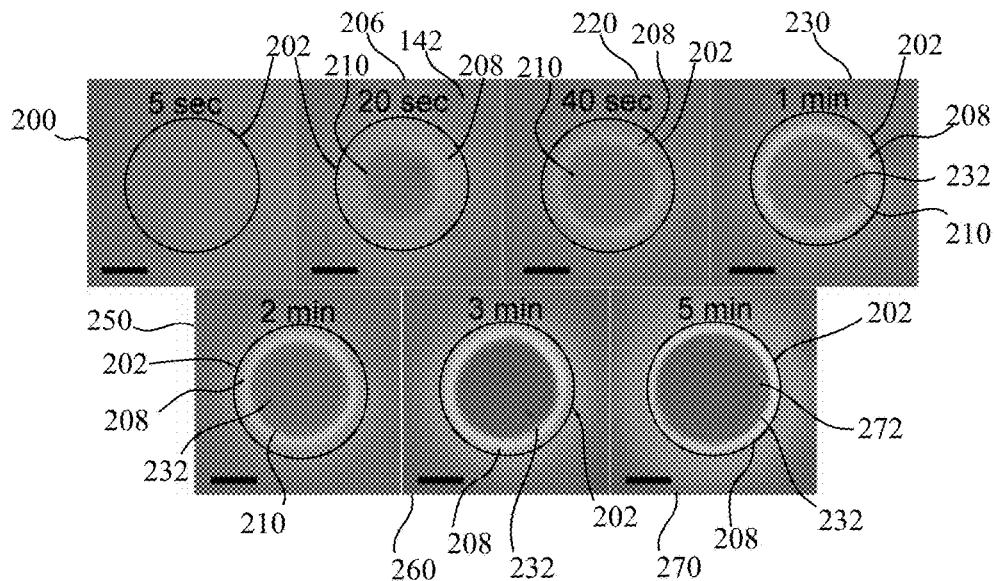
FIG. 14 depicts optical micrographs of the graphene dot of FIG. 8 at different times during irradiation with a continuous wave laser.

Image 200 of FIG. 14 was taken after a five second exposure with the laser beam 148. A careful examination of the image 200 reveals a circle beginning to form slightly inside of the circle 202. The Raman spectra associated with the image 200 is depicted as line 204 of FIG. 15. The Raman spectra 204 shows a slight modification from a Raman spectra 206 which was obtained prior to exposing the quartz substrate 140, photoresist layer 142, and quartz wafer 146 to the laser beam 148. The Raman spectra 202 thus indicates some disordered Raman signals which might result from fragments from decomposition of S-1805 photoresist. The Raman spectra 202 does not, however, include any indicia of graphene formation. Thus, while decomposition of the photoresist layer 142 has begun, no graphene has formed. Additionally, the lack of any ring structure indicates that the quartz substrate 140 has not begun to melt.

Image 206 of FIG. 14 was obtained after 20 seconds of exposure to the laser beam 148. A ring 208 has started to appear and a center portion 210 is markedly darker than the surrounding photoresist layer 142. The ring 208 is formed farther inwardly of the circle 202 than the circle identified as starting to form in image 202. Additionally, the photoresist layer 142 outwardly of the circle 202 has lightened. This indicates that the photoresist layer 142 outwardly of the circle 202 is decomposing.

Figure 15:
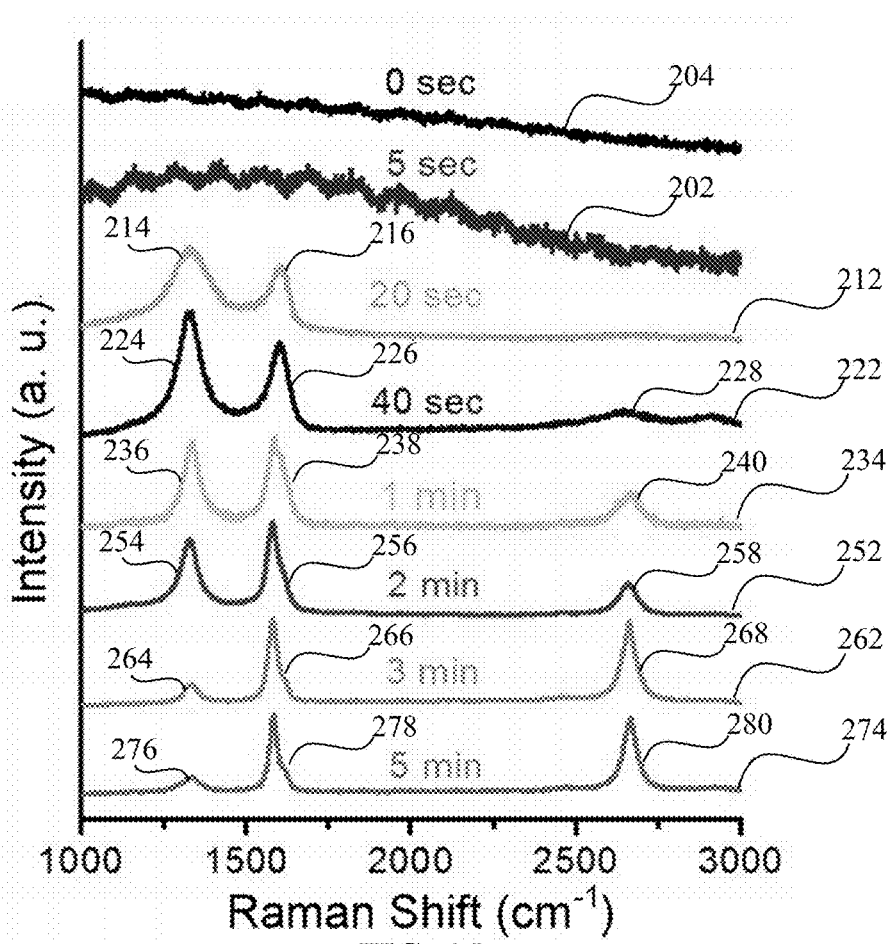
FIG. 15 depicts the corresponding Raman spectra recorded from the center of the laser-irradiated areas in FIG. 14.

The Raman spectra 212 of FIG. 15 is associated with the image 206. The Raman spectra 212 includes a broad D band 214 and a broad G band 216. There is, however, no 2D band. Accordingly, the Raman spectra 212 indicates that carbon has been released from the photoresist layer 142 but has not formed graphene. Additionally, the carbon appears to be consolidating toward the center of the image 206, hence the darkened center portion 210.

Image 220 was taken after a 40 second exposure. Noticeable changes are evident in comparing image 220 to image 206. The diameter of the ring 208 has expanded to substantially the same size as the circle identified as starting to form in image 202. The ring 208 is also more clearly defined. Additionally, the center portion 210 has expanded, while maintaining substantially the same shading as the smaller version of the center portion 210 in image 206.

The Raman spectra 222 of FIG. 15 is associated with the image 220. The Raman spectra 222 includes a better defined D band 224 and a better defined G band 226. A slight 2D band 228 is also beginning to be evidenced. Accordingly, the Raman spectra 222 indicates that graphene has begun to form within the center portion 210.

Image 230 was taken after a one minute exposure. Further changes are evident in comparing image 230 to image 220. The diameter of the ring 208 has expanded to substantially the same size as the circle identified as starting to form in image 202. The ring 208 is also brighter, but the inner edge of the ring 208 is rougher than in the image 220. Additionally, the center portion 210 has expanded, and a darker central portion 232 is evident.

The Raman spectra 234 of FIG. 15 is associated with the image 230. The Raman spectra 234 includes a D band 236 and a G band 238 which are more clearly divided. Additionally, the D band 236 has decreased in intensity from the level of the D band 224. A 2D band 240 is also better defined. Accordingly, the Raman spectra 234 indicates that graphene has continued to form within the center portion 210.

Image 250 was taken after a two minute exposure. The main difference when comparing image 250 to image 230 is that the darker central portion 232 has enlarged significantly. The ring 208 is also slightly brighter, and better defined than in the image 230.

The Raman spectra 252 of FIG. 15 is associated with the image 250. The Raman spectra 252 includes a D band 254 and a G band 256. The D band 254 is now less intense than the G band 256. A 2D band 258 is larger and narrower than the 2D band 240. Accordingly, the Raman spectra 252 indicates that graphene has continued to form within the center portion 210.

Image 260 was taken after a three minute exposure. The main difference when comparing image 260 to image 250 is that the darker central portion 232 appears to extend completely to the edge of the ring 208 and the ring 208 is brighter in image 260. The ring 208 in image 260 has also expanded in diameter, although it is still smaller in diameter than the circle 202.

The Raman spectra 262 of FIG. 15 is associated with the image 260. The Raman spectra 262 includes a D band 264 and a G band 266. The D band 264 is now rather small while the size of the G band 266 is comparable to the G band 256. The 2D band 268 intensity is greater than the 2D band 258, and roughly equivalent to the G band 266. Accordingly, the Raman spectra 262 indicates that graphene has continued to form within the center portion 210.

Image 270 was taken after a five minutes exposure. The main difference when comparing image 270 to image 260 is that another dark portion 272 has appeared within the darker central portion 232. Additionally, the ring 208 has expanded to be substantially the same diameter as the circle 202.

The Raman spectra 274 of FIG. 15 is associated with the image 270. The Raman spectra 274 includes a D band 276 and a G band 278. The D band 276 has become even smaller while the G band 276 is comparable to the G band 266. The 2D band 280 remains roughly equivalent to the G band 278. Accordingly, the Raman spectra 274 indicates that graphene has continued to form within the center portion 210.

Figure 16:
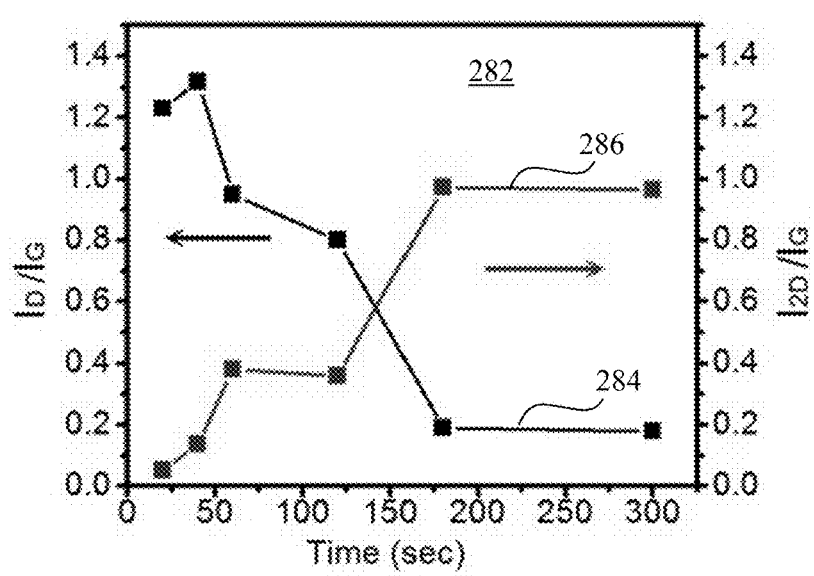
FIG. 16 depicts the intensity of ratios ID/IG and I2D/IG of the graphene dots in FIG. 14 as a function of growth time.

Several conclusions are possible based upon the foregoing data. For example, FIG. 16 shows a chart 282 of the $ID/I_G$ ratio 284 and the $I_{2D}/I_G$ ratio 286 as a function of laser processed time. FIG. 16 indicates the graphene domain size was increasing gradually with laser illumination time, indicating the graphene crystallization process.

FIGS. 14 and 15 confirm that graphene domain size was increasing gradually with laser illumination time, indicating the graphene crystallization process. After three minutes, two or three layers of graphene was been formed. FIGS. 14 and 15 further implicate a growth mechanism wherein the focused laser beam 148 raises the temperature in the S1805 film, driving the decomposition of S-1805 to form amorphous carbon and carbon vapor.

More specifically, FIG. 9 indicated that the upper surface 144 of the quartz substrate 140 has been remodeled by melting and the ring 162, in particular, is the result of such remodeling. Since quartz substrate 140 is not directly heated by the laser beam 148, an intermediary is necessary. FIG. 14 indicates that decomposition of the photoresists layer 144 precedes the remodeling of the upper surface 144. Accordingly, one or more of the amorphous carbon and carbon vapor are the most likely candidates for transferring heat to the quartz substrate 140.

In the absence of remodeling of the quartz wafer 146 which is exposed to the carbon vapor but not the amorphous carbon, the main or sole heat transfer mechanism is the amorphous carbon in contact with the quartz substrate 140. Consequently, the appearance of the ring 208 in image 206 indicates that amorphous carbon was formed slightly prior to the twenty second image 206.

Once the quartz substrate 140 begins to melt, at least some of the amorphous carbon is infused into the melted quartz. The carbon vapor which is trapped by the quartz wafer 146 provides another source for infusion of carbon into the melted quartz, and increases the amount of graphene which is ultimately formed. The quartz wafer 146 also acts as a thermal insulator, keeping the portion of the quartz substrate 140 within the laser beam 148 from losing heat.

Once the laser beam 148 is terminated, the melted quartz begins to cool. During cooling of the melted quartz/carbon mixture, the dissolved carbon atoms are separated and nucleated. These precipitated carbon atoms form graphene segments because $sp^2$-bonded graphene is energetically more favorable than $sp^3$-rich amorphous carbon.

Figure 17:
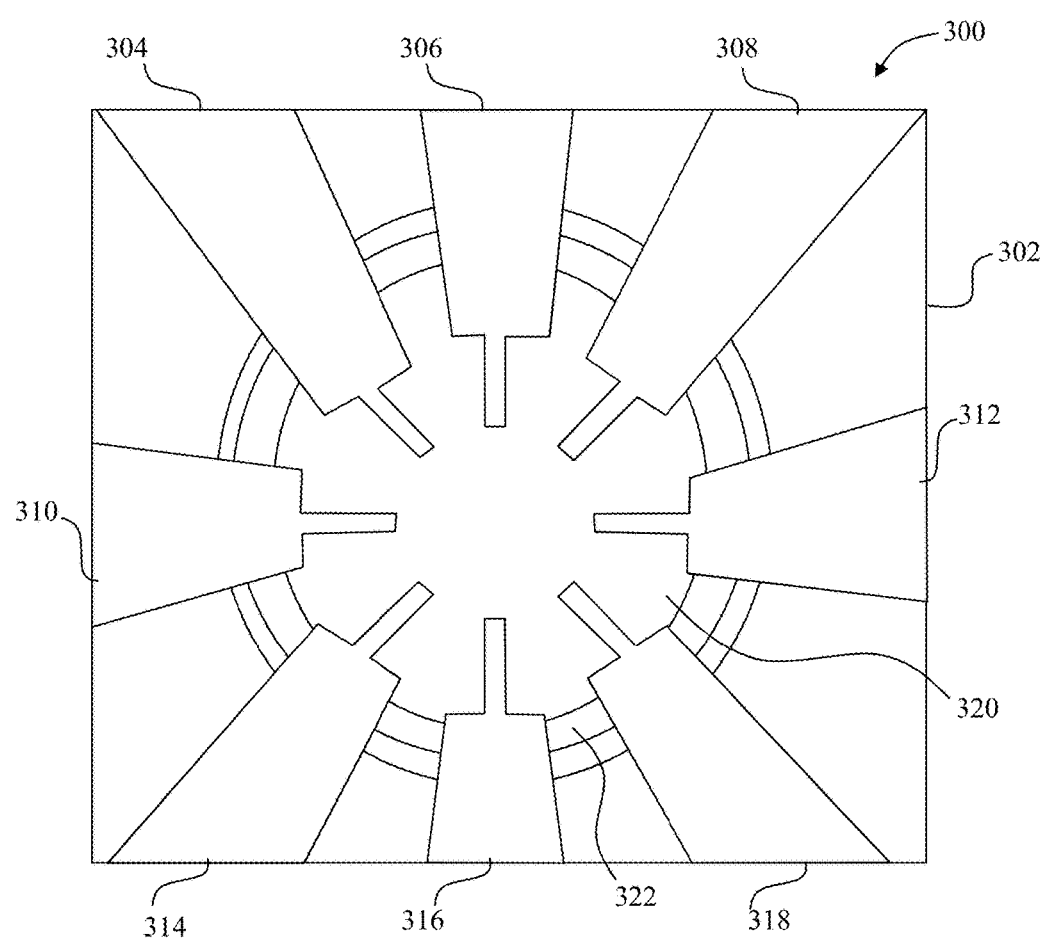
FIG. 17 depicts a top plan view of a laser formed graphene film or dot interconnecting a plurality of contacts.

FIG. 17 depicts a portion of a device 300 which includes a quartz substrate 302 with a plurality of contacts 304, 306, 308, 310, 312, 314, 316, and 318 formed thereon. The contacts 304, 306, 308, 310, 312, 314, 316, and 318 were fabricated of Ti/Au, 20 nm/80 nm, using e-beam lithography. The contacts 304, 306, 308, 310, 312, 314, 316, and 318 are electrically connected by a graphene connector 320 which was formed in accordance with the process 130 of FIG. 1. The graphene connector 320 is surrounded by a ring of carbon 322.

The conducting quality of a graphene layer formed in accordance with the above described laser-induced process was evaluated using the device 300. In the device 300, each of the contacts 304, 306, 308, 310, 312, 314, 316, and 318 is positioned 20 μm away from the oppositely positioned contact. Sheet resistance between oppositely position contacts was obtained by 2-point current-voltage (I-V) measurement and 4-point Van der Pauw method at the room temperature. Results of a current-voltage (I-V) measurement obtained between the oppositely positioned contacts are depicted in graph 330 of FIG. 18.

Figure 18:
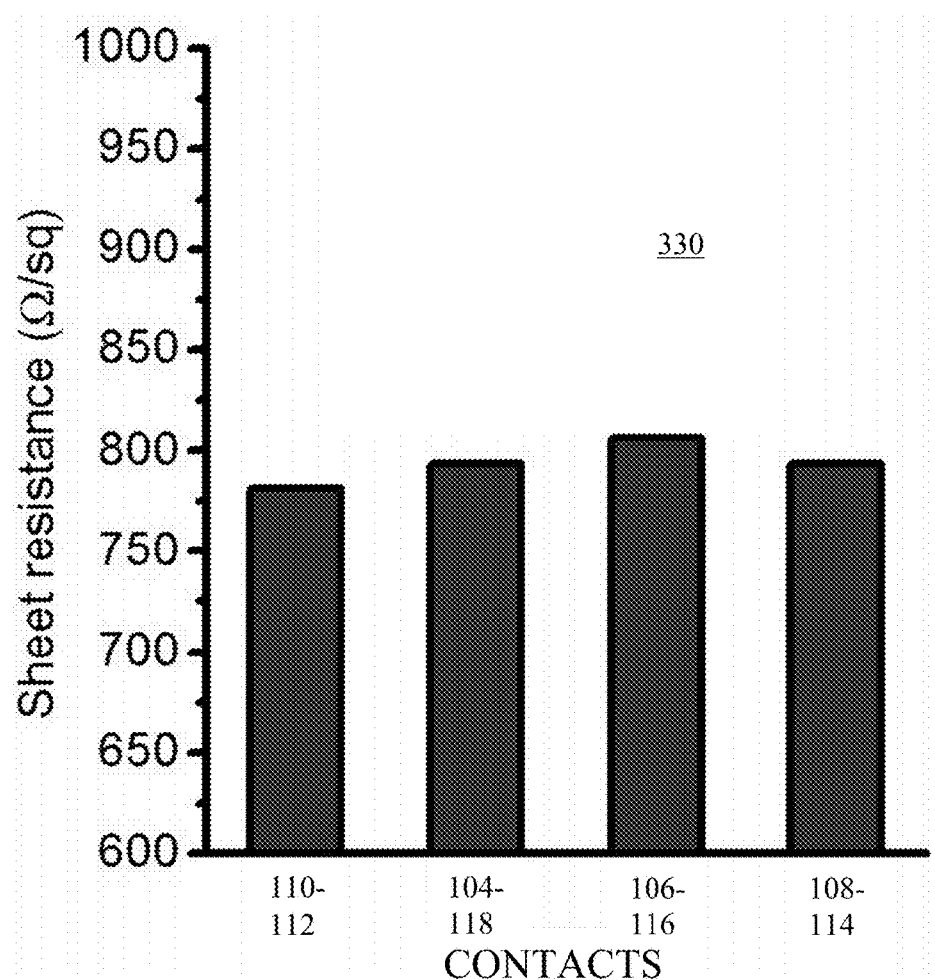
FIG. 18 depicts a chart of the sheet resistances between different contacts in the device of FIG. 17.

The results depicted in FIG. 18 reveal sheet resistance values in the range of 780-805 Ω/sq. This value is comparable with values measured for wet-transferred graphene layers (650-900 Ω/sq) and chemically reduced graphene oxide layers (700-1300 Ω/sq). The above described laser-induced process resulted in values that were lower than values of Cu-catalyzed graphene layers (50-75 Ω/sq) but much better than Ni-catalyzed graphene layers (6 k-11 kΩ/sq) and catalyst-free nanographene layers (7 k-11 kΩ/sq). Therefore, the laser-induced graphene formation process has potential applications in transparent electrode, cathode ray tube, and touch screens.

The laser-induced graphene formation process described herein provides a laser-induced graphene growth method for growing graphene directly on an insulating substrate, quartz. This simple, rapid, single-step, and controllable method for synthesizing graphene has significant promise for graphene-device fabrication and applications. The laser-induced graphene formation process is in general an attractive alternative technique for materials synthesis, with the intrinsic benefits of localized, fast, and single-step synthesis. In contrast to the conventional thermal chemical vapor deposition (CVD) process, laser-induced graphene formation can produce a much higher temperature in a confined area, while the rest of the material (substrate) still maintains at the room temperature.

The data presented above further indicates that as is true with the commonly used CVD approach for growing graphene on metals, the growth temperature, pressure, concentration of carbon sources, and solubility of carbon are basic factors, which contribute to the formation and quality of graphene film in the laser-induced graphene formation process. Deformation of the laser-processed area, however, suggests that the surface experienced melting in the formation of graphene. Therefore, the growth mechanism of graphene on quartz is not the same as the surface-catalyzed process or carbon dissolution and precipitation in solid metal when graphene is grown in metal.

While the invention has been illustrated and described in detail in the drawings and foregoing description, the same should be considered as illustrative and not restrictive in character. Only the preferred embodiments have been presented and all changes, modifications and further applications that come within the spirit of the invention are desired to be protected.

The invention claimed is:

1. A method of forming at least one graphene layer, comprising:
   providing a quartz substrate;
   forming a photoresist layer portion on an upper surface of the quartz substrate, the photoresist layer portion including a form of carbon;
   decomposing the photoresist layer portion to release the form of carbon;
   using the form of carbon to transfer heat to melt a portion of the quartz substrate located beneath the decomposed photoresist layer portion; and
   coalescing the form of carbon into at least one graphene layer on the quartz substrate.

2. The method of claim 1, further comprising:
   trapping the released form of carbon above the upper surface of the quartz substrate.

3. The method of claim 2, further comprising:
   positioning a quartz wafer above the upper surface of the quartz substrate such that the quartz wafer inhibits dispersion of the released form of carbon.

4. The method of claim 3, wherein decomposing comprises:
   heating the photoresist layer portion with a continuous wave laser.

5. A method of forming at least one graphene layer, comprising:
   providing a quartz substrate;
   forming a photoresist layer portion on an upper surface of the quartz substrate, the photoresist layer portion including a form of carbon;
   decomposing the photoresist layer portion to release the form of carbon;
   using the form of carbon to transfer heat to melt a portion of the quartz substrate located beneath the decomposed photoresist layer portion;
   diffusing the form of carbon into the melted portion to form a carbon and quartz mixture; and
   precipitating at least one graphene layer out of the carbon and quartz mixture.

6. The method of claim 5, further comprising:
   trapping the released form of carbon above the upper surface of the quartz substrate.

7. The method of claim 6, further comprising:
   positioning a quartz wafer above the upper surface of the quartz substrate such that the quartz wafer inhibits dispersion of the released form of carbon.

8. The method of claim 7, wherein decomposing comprises:
   heating the photoresist layer portion with a continuous wave laser.

9. A method of forming at least one graphene layer, comprising:
   providing a quartz substrate;
   forming a photoresist layer portion on an upper surface of the quartz substrate, the photoresist layer portion including a form of carbon;
   decomposing the photoresist layer portion to release the form of carbon;
   using the form of carbon to transfer heat to melt a portion of the quartz substrate located beneath the decomposed photoresist layer portion; and
   precipitating the form of carbon into at least one graphene layer on the quartz substrate.

10. The method of claim 9, further comprising:
    trapping the released form of carbon above the upper surface of the quartz substrate.

11. The method of claim 10, further comprising:
    positioning a quartz wafer above the upper surface of the quartz substrate such that the quartz wafer inhibits dispersion of the released form of carbon.

12. The method of claim 11, wherein decomposing comprises:
    heating the photoresist layer portion with a continuous wave laser.

* * * * *